(12) United States Patent
Warashina et al.

(10) Patent No.: US 7,433,554 B2
(45) Date of Patent: Oct. 7, 2008

(54) OPTICAL WIRING BOARD AND METHOD FOR MANUFACTURING OPTICAL WIRING BOARD

(75) Inventors: Yoshihisa Warashina, Hamamatsu (JP); Yasuji Hoshino, Hamamatsu (JP); Hajime Takeyama, Hamamatsu (JP); Masaaki Muto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/589,604

(22) PCT Filed: Feb. 15, 2005

(86) PCT No.: PCT/JP2005/002250

§ 371 (c)(1),
(2), (4) Date: Aug. 13, 2007

(87) PCT Pub. No.: WO2005/078490

PCT Pub. Date: Aug. 25, 2005

(65) Prior Publication Data

US 2007/0280585 A1 Dec. 6, 2007

(30) Foreign Application Priority Data

Feb. 17, 2004 (JP) ............................. 2004-040449

(51) Int. Cl.
*G02B 6/12* (2006.01)
*G02B 6/10* (2006.01)

(52) U.S. Cl. ............................. 385/14; 385/88; 385/132
(58) Field of Classification Search .................. 385/14, 385/32, 39, 88–94, 129–132
See application file for complete search history.

(56) References Cited

U.S. PATENT DOCUMENTS 4,732,446 A * 3/1988 Gipson et al. .................. 385/24
7,149,376 B2 * 12/2006 Uchida et al. .................. 385/15

FOREIGN PATENT DOCUMENTS

| JP | 5-67770 | 3/1993 |
|---|---|---|
| JP | 2000-227524 | 8/2000 |
| JP | 2001-21769 | 1/2001 |
| JP | 2001-196494 | 7/2001 |

\* cited by examiner

*Primary Examiner*—Sung Pak
*Assistant Examiner*—Daniel Petkovsek
(74) *Attorney, Agent, or Firm*—Drinker Biddle & Reath LLP

(57) ABSTRACT

An optical wiring board by which an optical waveguide can be easily aligned with a light emitting element and a light detecting element. The optical wiring board (1) is provided with a substrate (10). On the substrate (10), a plurality of recessed parts (12) are formed, and the optical waveguide (13) is formed between the recessed parts (12). In the recessed part (12), a light receiving/emitting member (30), which is mounted on an inserting part (22) on a base member (20), is arranged. In the inserting member (22), reflecting planes (26, 27) are formed on inclined planes, and an optical path of the optical waveguide (13) matches with that of a light detecting part (34) and a light emitting part (37) in the light receiving/emitting member (30) via the reflecting planes (26, 27).

8 Claims, 12 Drawing Sheets

(a)

(b)

(a)

(b)

(a)

(b)

OPTICAL WIRING BOARD AND METHOD FOR MANUFACTURING OPTICAL WIRING BOARD

TECHNICAL FIELD

This invention concerns an optical wiring substrate and a method for manufacturing an optical wiring substrate.

BACKGROUND ART

With the recent increase of capacities of storage devices of personal computers, etc., higher demands are being made for signal processing at high speed, and as means for meeting such circumstances, there are optical wiring substrates that perform signal communication by light. As an example of such an optical wiring substrate, an optoelectronic integrated circuit device is disclosed in Patent Document 1, indicated below. This optoelectronic integrated circuit device has an optoelectronic integrated circuit substrate, on which an electronic circuit, a light emitting element, and a photodetecting element are formed, and an optical wiring substrate, on which optical waveguides are formed. Inclined surfaces, each corresponding to the light emitting element or the photodetecting element, are formed on the optical wiring substrate and ends of the optical waveguides are positioned at the inclined surfaces. Furthermore, reflecting films that reflect light for optical coupling of the optoelectronic integrated circuit substrate are formed on the inclined surfaces.

Patent Document 1: Japanese Published Unexamined Patent Application No. Hei-5-67770

DISCLOSURE OF THE INVENTION

Objects to be Solved by the Invention

However, with the optoelectronic integrated circuit device disclosed in the above-described Patent Document 1, the optoelectronic integrated circuit is disposed at a protrusion between the inclined surfaces. Thus for light emitted from the light emitting element to be reflected by a reflecting surface and guided into an optical waveguide or the light emitted from an optical waveguide to be reflected by a reflecting surface and guided to the photodetecting element, the optoelectronic integrated circuit must be positioned with high precision with respect to the optical wiring substrate. However, measures for highly precise positioning are not taken and an extreme amount of trouble is taken to carry out positioning.

An object of this invention is thus to provide an optical wiring substrate that enables positioning of light emitting elements and photodetecting elements with respect to optical waveguides to be readily performed.

SUMMARY OF THE INVENTION

An optical wiring substrate according to the present invention that achieves the above object includes: a substrate, having a plurality of recessed portions formed therein; optical waveguides, formed on the substrate and disposed between the plurality of recessed portions; a plurality of base members, each having an inserted portion, having inclined surfaces formed thereon and being inserted into a recessed portion, and a supporting portion, supporting the inserted portion that is inserted into the recessed portion; photonic devices, each being mounted onto the inserted portion of a base member and disposed at an inner side of a recessed portion of the substrate; penetration electrodes, each penetrating through from a surface of a base member on which photonic devices are mounted to a base member surface at the opposite side; and reflecting surfaces, each formed on an inclined surface of an inserted portion and reflecting light that passes through optical paths between optical waveguides and photonic devices; and the inclination angle of each inclined surface is adjusted to an angle by which optical paths are matched between the corresponding optical waveguides and photonic devices, and the reflecting surfaces and the optical waveguides are positioned by the inserted portion of the corresponding base member being inserted into the corresponding recessed portion.

With the optical wiring substrate according to this invention, by the inserted portion of a base member, onto which photonic devices are mounted, being inserted into a recessed portion formed in the substrate, the reflecting surfaces formed on the inserted portion are positioned with respect to corresponding optical waveguides formed on the substrate. The positioning of the optical waveguides and the reflecting surfaces, attached to the base member, can thus be performed accurately and readily, and optical waveguides and photodetecting elements can thus be positioned accurately and readily with respect to light emitting elements and other photonic devices.

Here, a mode is possible in which a photonic device, positioned at a recessed portion at one end of an optical waveguide, is a light emitting element, and a photonic device, positioned at a recessed portion at the other end of the optical waveguide, is a photodetecting element.

By thus arranging a mode, in which a light emitting element is disposed at one end of an optical waveguide and a photodetecting element is disposed at the other end, input and output of optical signals can be readily performed.

Also, a mode is possible in which a light emitting element and a photodetecting element are disposed as photonic devices in a single recessed portion.

By a light emitting element and a photodetecting element thus being disposed in a single recessed portion, a communication process can be performed with any of light emitting elements and photodetecting elements disposed in other recessed portions.

Furthermore, a mode is possible in which photonic devices are mounted onto a base member via a wiring substrate.

By thus arranging a mode, in which photonic devices are mounted onto a base member via a wiring substrate for photonic devices, for example, a plurality of photonic devices disposed in a single recessed portion can be connected by wirings provided in the wiring substrate.

A mode is also possible in which photonic devices are directly mounted onto a base member.

By photonic devices being directly mounted on a base member, the space inside a recessed portion can be effectively utilized.

A mode is also possible in which the base members are silicon substrates.

Silicon substrates can be favorably used as the base members.

Furthermore, a mode is also possible in which the inclined surfaces are formed by anisotropic etching.

By using silicon substrates as the base members and forming the inclined surfaces by anisotropic etching, the inclined surfaces can be formed with high precision.

A mode is also possible in which the shapes of the inserted portions and the recessed portions, as observed in the direction of looking into the recessed portions, are polygonal shapes.

By the shapes of the inserted portions and the recessed portions, as observed in the direction of looking into the recessed portions, being polygonal shapes, numerous reflecting surfaces can be formed. The variation of positioning of the recessed portions on the substrate can thus be increased.

On the other hand, an optical wiring substrate manufacturing method according to the present invention that achieves the above problems includes the steps of:

forming optical waveguides on a substrate;

forming a plurality of recessed portions on the optical waveguides on the substrate;

manufacturing a plurality of base members, each having inclined surfaces formed thereon, the inclination angles of which are adjusted to angles for matching optical paths between the optical waveguides and photonic devices, and having an inserted portion, inserted into the recessed portion, and a supporting portion, supported on a top surface of the substrate and supporting the inserted portion inserted into the recessed portion;

forming reflecting surfaces on the inclined surfaces;

disposing penetration electrodes, each penetrating through a surface of the base member onto which the photonic devices are mounted to a base member surface at the opposite side;

mounting the photonic devices, to be positioned in the recessed portions of the substrate, onto the inserted portions of the base members; and inserting the inserted portions of the base members into the recessed portions and thereby positioning the reflecting surfaces and the optical waveguides.

With the optoelectronic wiring substrate according to this invention, by the inserted portion of a base member, onto which a photonic device is mounted, being inserted into the corresponding recessed portion formed in the substrate, the reflecting surfaces formed on the inserted portion are positioned with respect to the optical waveguides formed on the substrate. The positioning of the optical waveguides and the reflecting surfaces, attached to the base member, can thus be performed accurately and readily, and optical waveguides and photodetecting elements can thus be positioned accurately and readily with respect to photonic devices such as light emitting elements.

Here, a mode is possible in which the base members are manufactured by forming a base material of base member, in which a plurality of base members are formed in continuation, and thereafter dicing the base material of base member.

By thus forming the base members, the plurality of base members can be readily manufactured.

A mode is also possible in which the inclined surfaces of the base members are formed by anisotropic etching.

By forming the inclined surfaces of the base members by anisotropic etching, the inclined surfaces can be formed with high precision.

EFFECT OF THE INVENTION

By this invention, an optical wiring substrate that enables positioning of light emitting elements and photodetecting elements with respect to optical waveguides to be performed readily can be provided.

DESCRIPTION OF THE SYMBOLS

Figure 1:
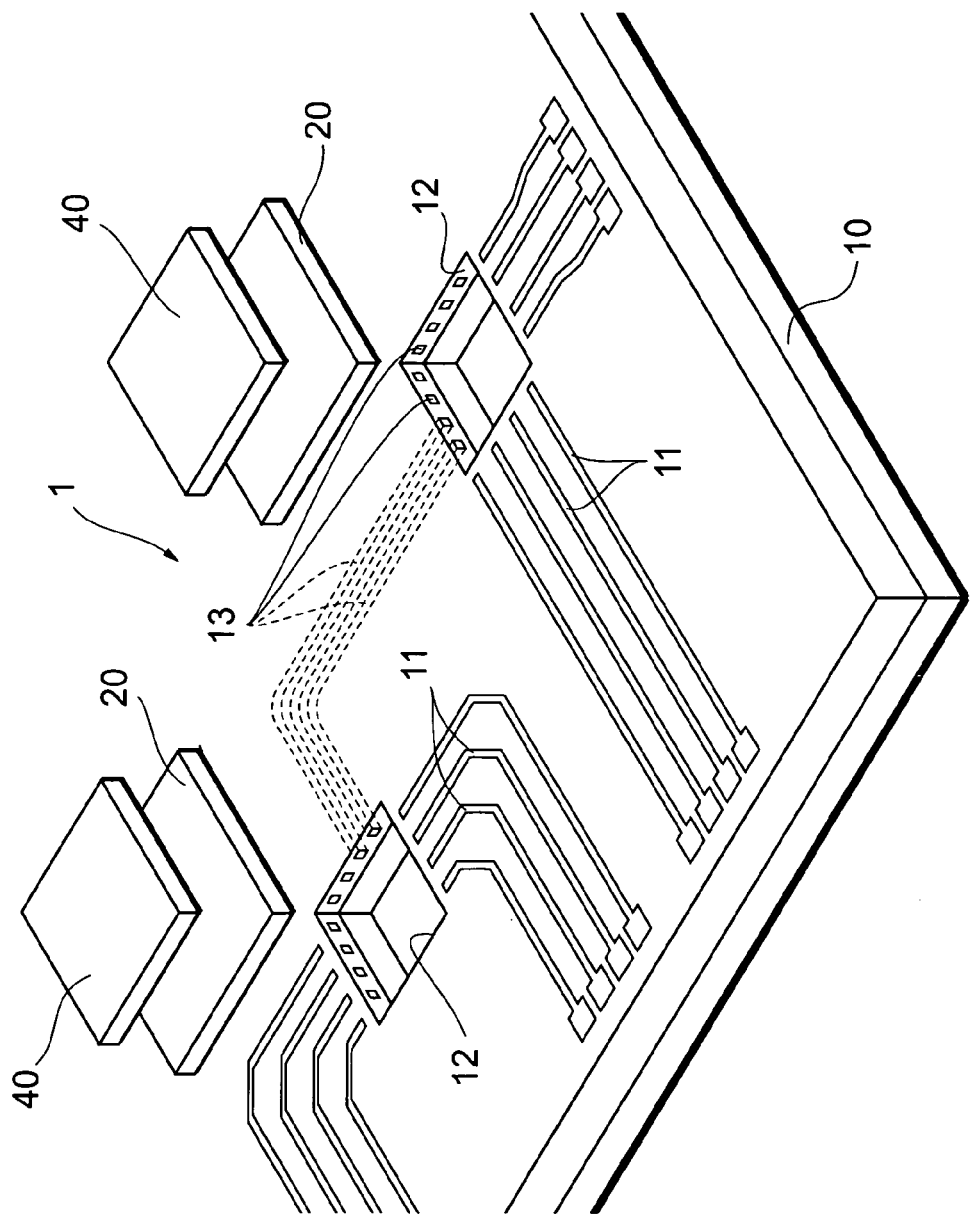
FIG. 1 is a schematic perspective view of principal portions of an optical wiring substrate according to an embodiment of this invention.

1 . . . Optical wiring substrate
10 . . . Substrate
11, 23 . . . Metallized pattern
12 . . . Recessed portion
13 . . . Optical waveguide
20 . . . Base Member
21 . . . Supporting portion
22 . . . Inserted portion
23C . . . Pattern wiring
24 . . . First inclined surface
25 . . . Second inclined surface
26 . . . Transmitting light reflecting surface
27 . . . Receiving light reflecting surface
28 . . . Photodiode connecting penetration electrode
29 . . . Laser connecting penetration electrode
30 . . . Photodetecting and light emitting member
31 . . . First photodiode array
32 . . . Second photodiode array
33 . . . Laser diode array
34 . . . Photodetecting unit
37 . . . Light emitting unit
40 . . . LSI
50 . . . Base material of base member
51 . . . Protrusion
52 . . . Recessed portion
53 . . . Penetration electrode
54 . . . Wiring pattern
55 . . . Reflecting surface
56 . . . Dicing line
57 . . . Base material of substrate
W . . . Bonding wire

BEST MODES FOR CARRYING OUT THE INVENTION

Preferred embodiments of this invention shall now be described with reference to the Drawings. In the respective embodiments, portions having the same function may be provided with the same symbol and overlapping description may be omitted.

Figure 2:
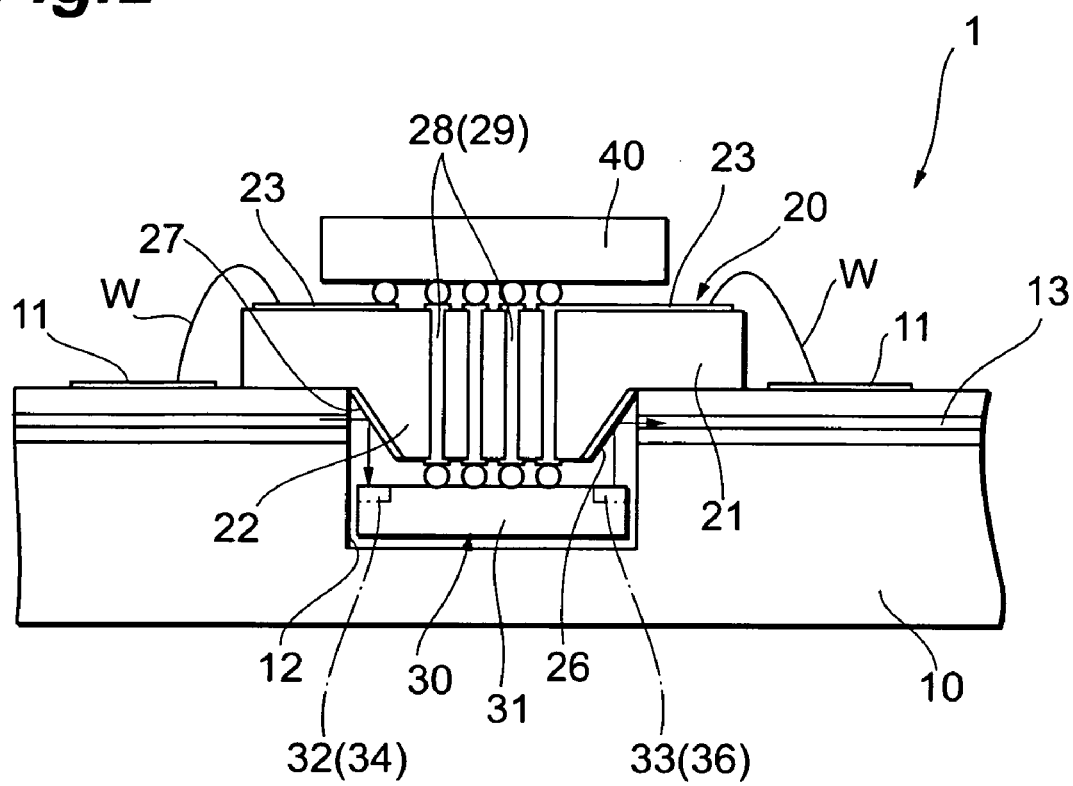
FIG. 2 is a schematic sectional side view of principal portions of the optical wiring substrate according to the embodiment of this invention.
Figure 3:
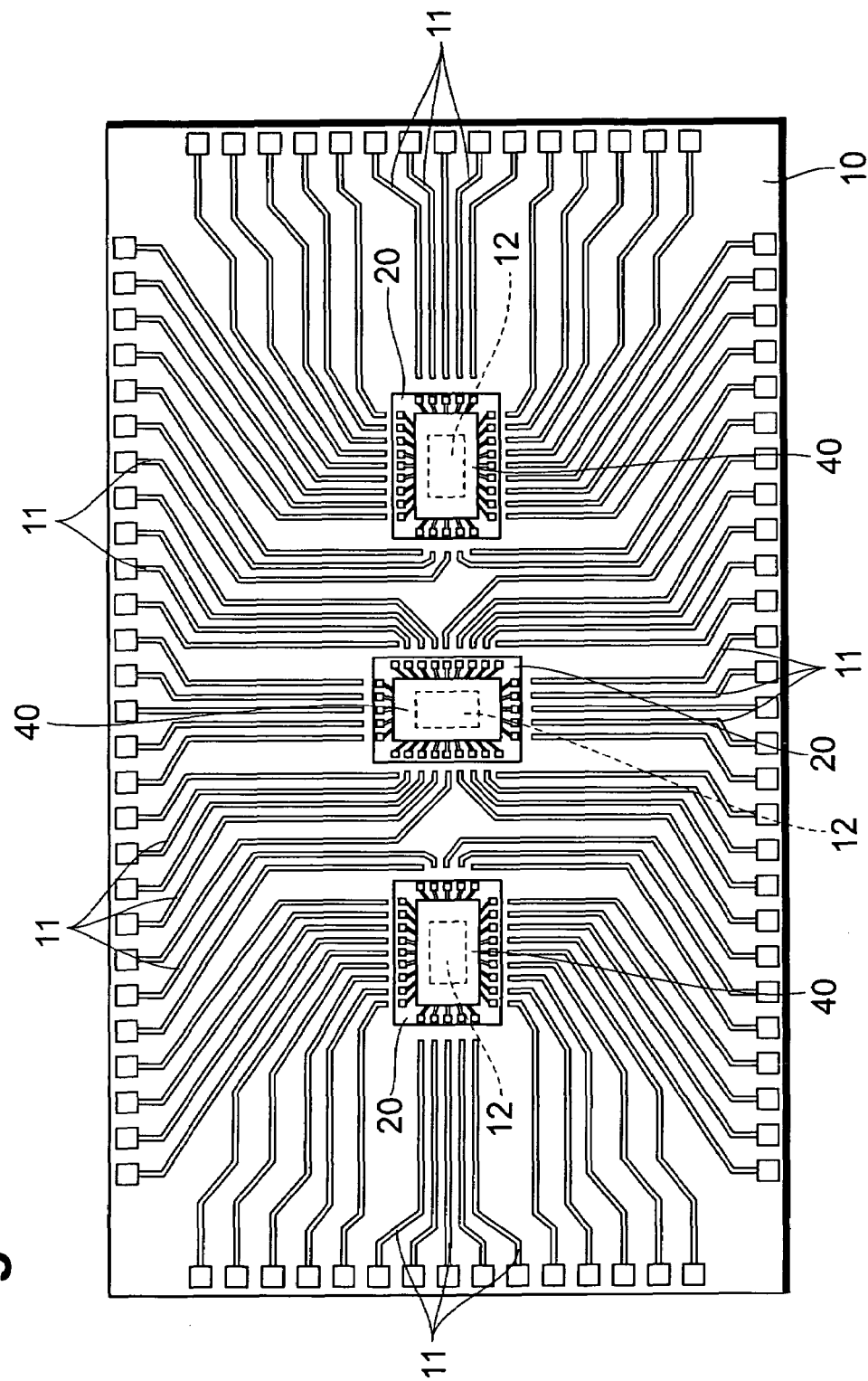
FIG. 3 is an overall plan view of the optical wiring substrate according to the embodiment of this invention.
Figure 4:
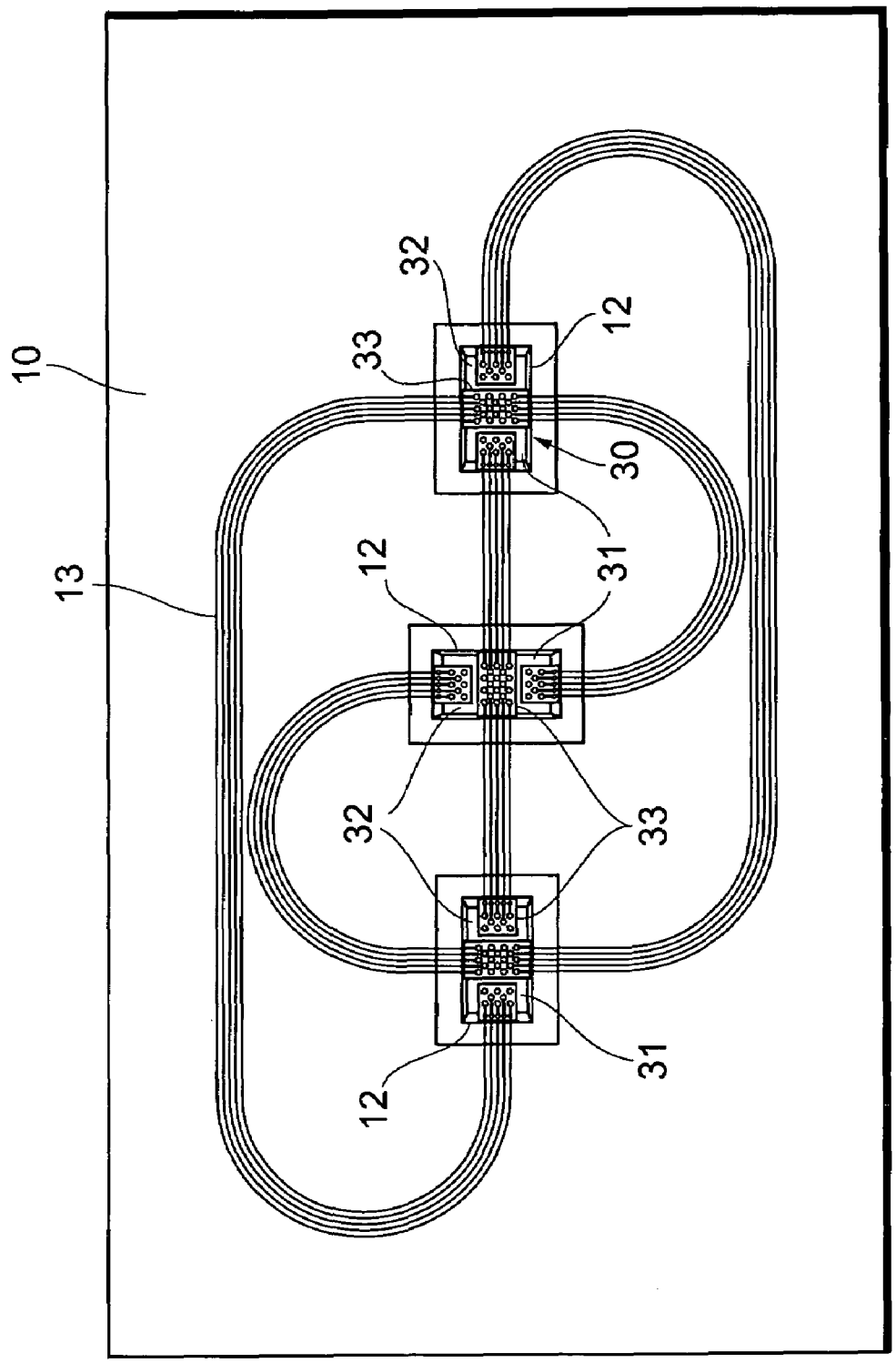
FIG. 4 is an overall transparent view of the optical wiring substrate according to the embodiment of this invention.

FIG. 1 is a schematic perspective view of principal portions of an optical wiring substrate according to an embodiment of this invention, FIG. 2 is a schematic sectional side view of principal portions of the same, FIG. 3 is an overall plan view of the same, and FIG. 4 is an overall transparent view of the same.

As shown in FIGS. 1 and 2, the optical wiring substrate 1 according to this embodiment includes a substrate 10, base members 20, photodetecting and light emitting members 30, and large scale integrated circuits (hereinafter referred to as "LSIs") 40.

The substrate (optical waveguide substrate) 10 is, for example, a silicon substrate, and on a top surface of the substrate 10 are formed metallized patterns 11 for low-speed and control signals and for power supply as shown in FIG. 3. A plurality of recessed portions 12 are formed on the top surface of the substrate 10. The number of the recessed portions 12 in the present embodiment is three, and each recessed portion 12 is positioned near the device side terminal portions of the metallized patterns 11. Inside each recessed portion 12A are housed a portion (inserted portion 22) of a base member 20 and a photodetecting and light emitting member 30. These recessed portions 12 are, for example, formed by reactive ion etching (RIE).

FIG. 4 transparently shows a section of the substrate 10 obtained by slicing across a plane parallel to a main surface of the substrate 10 at a position at which optical waveguides 13 pass through. As shown in the transparent view of FIG. 4, inside the substrate 10, the plurality of optical waveguides 13, having wiring functions, are disposed to connect recessed portions 12 to each other. Each optical waveguide 13 is formed, for example, of polyimide. Each recessed portion 12 has a rectangular shape as observed in a direction of looking into the recessed portion 12, and optical waveguides 13 are respectively connected to surfaces corresponding to the respective sides of the respective rectangles.

Figure 5:
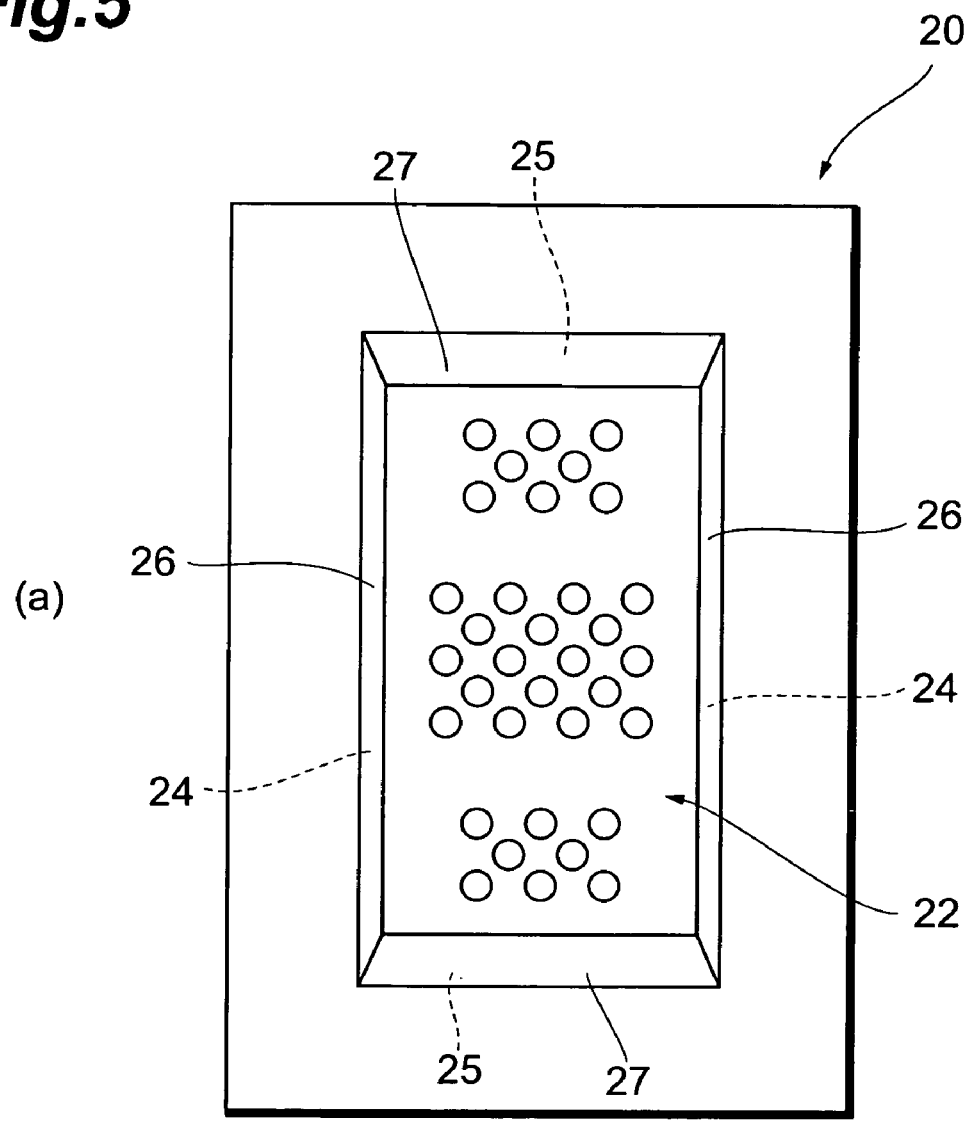
FIG. 5 shows diagrams of a base member, with FIG. 5-(a) being a rear view and FIG. 5-(b) being a side view.
Figure 5:
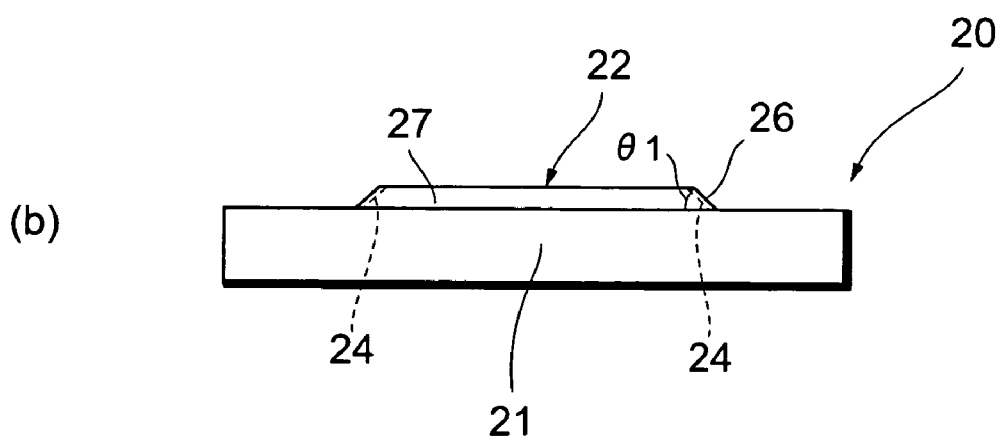
Figure 6:
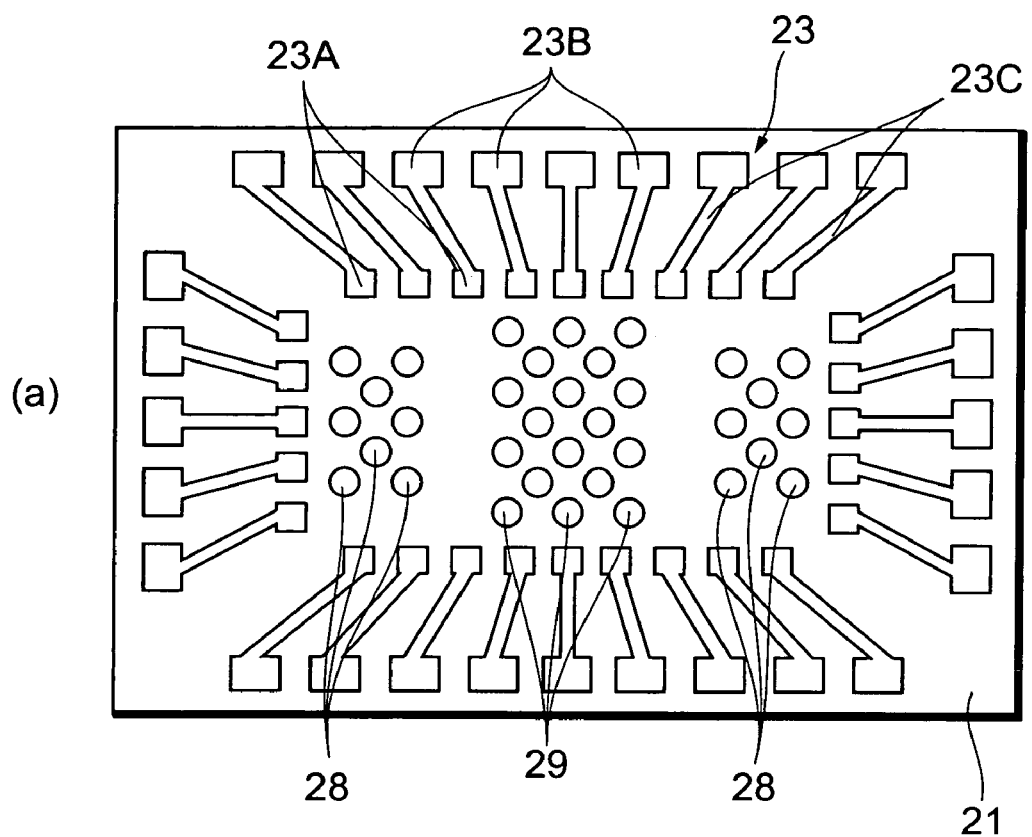
FIG. 6 shows diagrams of a base member, with FIG. 6-(a) being a plan view and FIG. 6-(b) being a front view.
Figure 6:
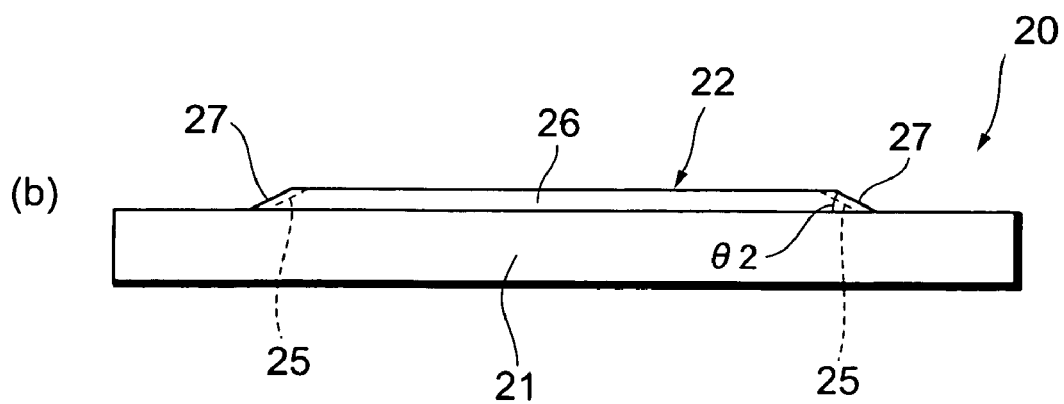

Each base member 20 is, for example, a silicon substrate and has a supporting portion 21 and inserted portion 22. As shown in FIGS. 5 and 6, when observed in the direction of looking into recessed portion 12, the supporting portion 21 has a surface of a plate-like form of a rectangular shape that is larger than the recessed portion 12, and the inserted portion 22 is disposed at a lower surface side of the supporting portion 21. Here, the lower surface side refers to the recessed portion 12 side. Metallized patterns 23 are formed on an upper surface of the supporting portion 21. The metallized patterns 23 include IC bonding pads 23A and wire bonding pads 23B as well as pattern wirings 23C that electrically connect the two types of pads. The wire bonding pads 23B are electrically connected via bonding wires W, shown in FIG. 2, to metallized patterns 11 formed on the substrate 10.

Meanwhile, the inserted portion 22 has a truncated rectangular pyramidal shape with a bottom surface of a rectangular shape that is smaller than the rectangular shape of the top surface of the supporting portion 21, and the outer peripheral surfaces thereof are arranged as the first inclined surfaces 24 and second inclined surfaces 25. The inserted portion 22 of the base member 20 is formed by anisotropic etching. The inclination angles of the first inclined surfaces 24 and second inclined surfaces 25 are thus formed with high precision. The procedure for manufacturing the base member 20 shall be described further later.

The area of an upper surface of the inserted portion 22 that forms a boundary with the supporting portion 21 is made slightly larger than or substantially the same as the area of an open end of the recessed portion 12 formed in the substrate 10, and the area of a lower surface of the inserted portion 22 is made smaller than the area of the open end of the recessed portion 12. Thus in the present embodiment, the shapes of the inserted portion 22 and recessed portion 12 as observed in the direction of looking into the recessed portion 12 are rectangular.

A surface of each first inclined surface 24 is coated with a transmitting light reflecting member, thereby forming a transmitting light reflecting surface 26, and a surface of each second inclined surface 25 is coated with a receiving light reflecting member, thereby forming a receiving light reflecting surface 27. As shown in FIG. 5-(b), each first inclined surface 24 forms an inclination angle $\theta 1$ of 45 degrees with respect to the interface of the supporting portion 21 and inserted portion 22, and as shown in FIG. 6-(b), each second inclined surface 25 forms an inclination angle $\theta 2$ of 35.3 degrees with respect to the interface of the supporting portion 21 and inserted portion 22. Both reflecting surfaces 26 and 27 are formed of aluminum vapor deposited films.

Furthermore, as shown in FIGS. 2 and 6, the supporting portion 21 and inserted portion 22 are provided with photodiode connecting penetration electrodes 28 and laser connecting penetration electrodes 29 that pass through from the upper surface of the supporting portion 21 to the lower surface of the inserted portion 22 at the opposite side. Photodiode connecting penetration electrodes 28 are positioned at side portions of the rectangular shape in a plan view of the inserted portion 22, and laser connecting penetration electrodes 29 are positioned at central portions.

Figure 7:
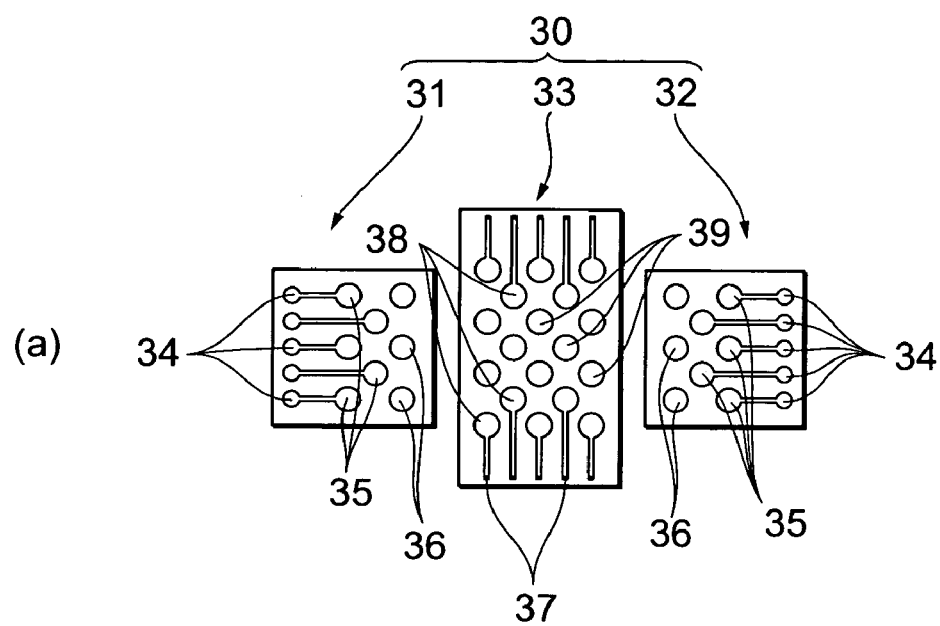
FIG. 7-(a) is a plan view of a photodetecting and light emitting unit and FIG. 7-(b) is a rear view of a state in which the photodetecting and light emitting unit is mounted onto the base member.
Figure 7:
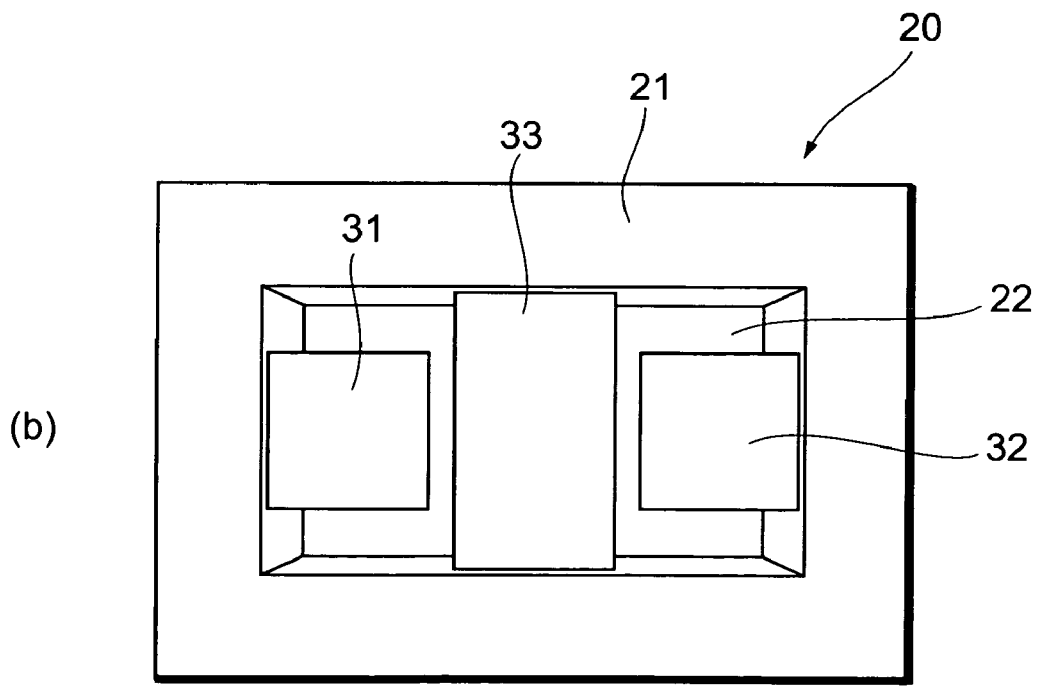

As shown in FIG. 7-(a), each photodetecting and light emitting member 30 includes two photodiode arrays 31 and 32, which are photodetecting elements, and a laser diode array 33, which is a light emitting element. The photodiode arrays 31 and 32 and laser diode array 33 are respectively mounted directly to the base member 20. As laser diodes of the laser diode array 33, vertical cavity surface emitting lasers (VCSEL) are used.

The first photodiode array 31 is provided with a plurality, that is, five in the present embodiment, of photodetecting units (photosensitive portions) 34, and the respective photodetecting units 34 are electrically connected to the anode electrodes 35. In a plan view, the respective photodetecting units 34 are directly positioned below a receiving light reflecting surface 27 of the inserted portion 22 of the base member 20. The first photodiode array 31 is provided with three cathode electrodes 36.

The second photodiode array 32 has the same arrangement as the first photodiode array 31 and has five photodetecting units 34 and anode electrodes 35 electrically connected thereto, as well as cathode electrodes 36.

The laser diode array 37 is provided with a plurality, that is, ten in the present embodiment, of light emitting units 37, and respective light emitting units 37 are electrically connected to the anode electrodes 38. In a plan view, the respective light emitting units 37 are positioned directly below the transmitting light reflecting surfaces 26 of the inserted portion 22 of the base member 20. Furthermore, laser diode array 33 is provided with eight cathode electrodes 39.

As shown in FIG. 7-(b), the photodiode arrays 31 and 32 and laser diode array 33 are directly mounted by flip chip bonding onto the inserted portion 22 of the base member 20. Anode electrodes 35 and cathode electrodes 36 of the photodiode arrays 31 and 32 are thereby electrically connected to the photodiode connecting penetration electrodes 28 in the base member 20. Also, anode electrodes 38 and cathode electrodes 39 of the laser diode array 33 are respectively connected to the laser connecting penetration electrodes 29 in the base member 20.

Thus with the photodetecting and light emitting member 30, photodetecting units 34 and light emitting units 37 are positioned at the peripheral portions thereof and electrodes 35, 36, 38, and 39 are positioned at central portions. Optical paths can thereby be formed between photodetecting units 34 and receiving light reflecting surfaces 27 and between light emitting units 37 and transmitting light reflecting surfaces 26. The inclination angles θ1 and θ2 are adjusted to angles for matching the optical paths of optical waveguides 13 and photodetecting units 34, provided on the photodetecting and light emitting member 30, and matching the optical paths of optical waveguides 13 and light emitting units 37.

Figure 8:
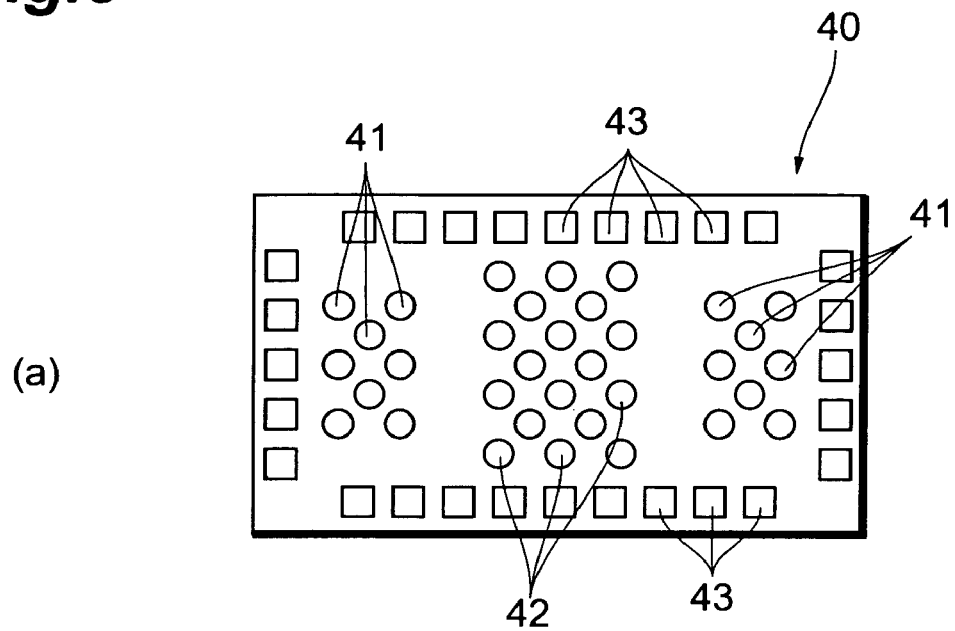
FIG. 8-(a) is a plan view of an LSI and FIG. 8-(b) is a plan view of a state in which the LSI is mounted onto the base member.
Figure 8:
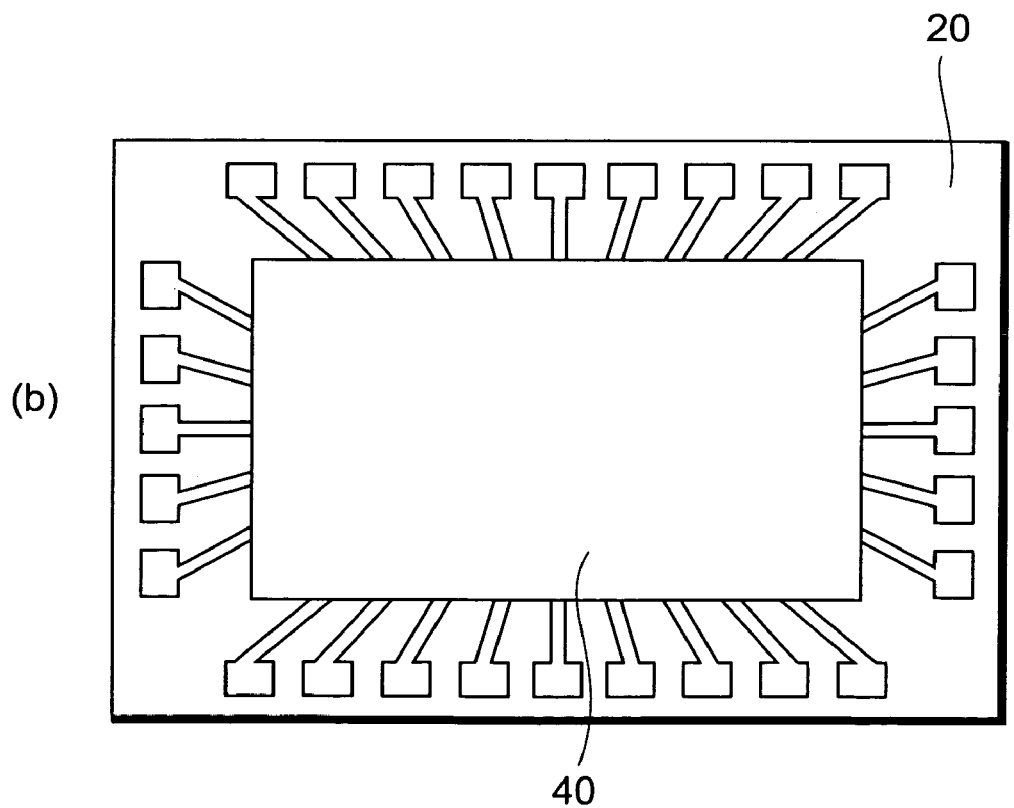

As shown in FIG. 8-(a), each LSI 40 has photodiode connecting pads 41 and laser connecting pads 42 provided on a surface. Also, bonding pads 43 for terminals for low-speed and control signals and for power supply are provided along a periphery of the surface side of the LSI 40. An unillustrated processing circuit is also provided.

As shown in FIG. 8-(b), the LSI 40 is mounted by flip chip bonding onto the upper surface of the supporting portion 21 of the base member 20. Photodiode connection pads 41 on the LSI 40 are electrically connected to photodiode connecting penetration electrodes 28 on the base member 20. Also, laser connecting pads 42 are connected to laser connecting penetration electrodes 29 on the base member 20 (see FIG. 2).

By the provision of penetration electrodes 28 and 29, the LSI 40 can be connected to the photodiode arrays 31 and 32 and the laser diode array 33 across an extremely short distance and without having to draw wirings. Since a silicon substrate is used as the base member 20, penetration electrodes 28 and 29 can be readily provided.

At the optical wiring substrate 1, the inserted portion 22 of the base member 20 and the photodetecting and light emitting member 30, mounted to the inserted portion 22, are inserted into the recessed portion 12 of the substrate 10, and the photodetecting and light emitting member 30 is positioned at the inner side of the recessed portion 12. Also by the inserted portion 22 of the base member 20 being inserted into the recessed portion 12, reflecting surfaces 26 and 27, formed on the inserted portion 22, and optical waveguides 13 can be readily positioned.

The photodiode arrays 31 and 32 and the laser diode array 33, mounted onto the inserted portion 22 of the base member 20, are positioned with high precision with respect to the base member 20. Lights emitted toward the recessed portion 12 from the optical waveguides 13 are thus reflected by the receiving light reflecting surfaces 27 and precisely made incident onto the photodetecting units 34 of photodiode arrays 31 and 32. Also, light emitted from light emitting units 37 of the laser diode array 33 is reflected by transmitting light reflecting surfaces 26 and precisely made incident onto the optical waveguides 13 (see FIG. 2).

Figure 9:
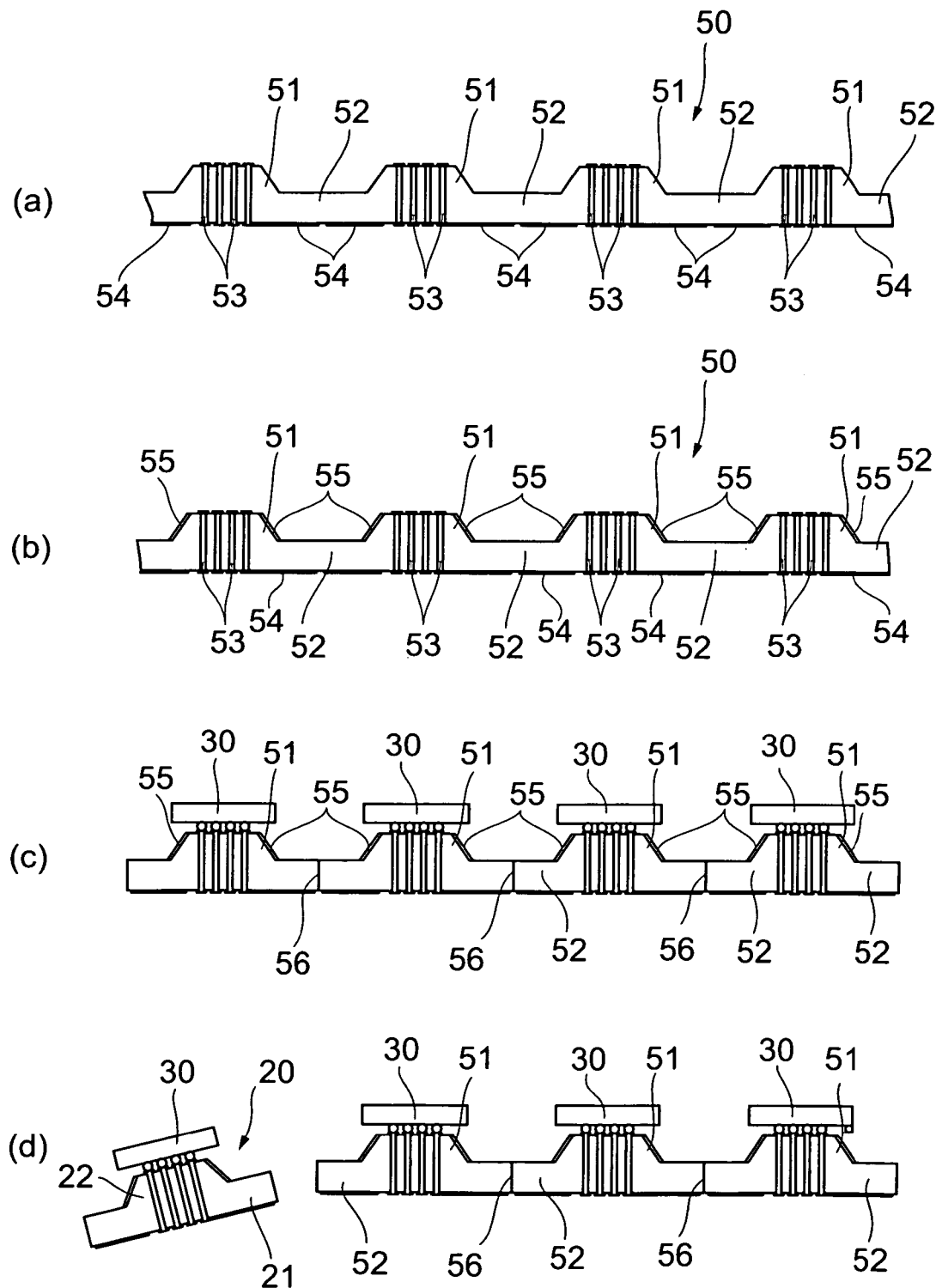
FIG. 9 shows process diagrams of a process of manufacturing base members.

A method for manufacturing the optical wiring substrate according to the present embodiment shall now be described. First, a method for manufacturing the base members 20 shall be described. FIG. 9 shows process diagrams of a process of manufacturing the base members.

First, a plate-like silicon substrate that is thicker than that which is normally used is prepared and anisotropic etching is performed from a top surface of the silicon substrate to manufacture a base material of base member 50, such as shown in FIG. 9-(a). A plurality of protrusions 51 and recessed portions 52 are alternately formed on the base material of base member 50. In each of these protrusions 51 of the base material of base member 50 are formed penetration electrodes 53 that pass through from the top surface to the rear surface. Predetermined wiring patterns 54 are also formed on the rear surface side.

Next, upon masking surface portions besides inclined surfaces of protrusions 51 of the base material of base member 50, that is, upon masking top surfaces of protrusions 51 and upper surfaces of recessed portions 52, aluminum vapor deposition is performed. By this aluminum vapor deposition, reflecting surfaces 55 are formed on the inclined surfaces of protrusions 51 as shown in FIG. 9-(b).

Then as shown in FIG. 9-(c), photodetecting and light emitting members 30 are mounted by flip chip bonding onto the respective top surfaces of the plurality of protrusions 51. Though photodetecting and light emitting members 30 of the arrangement shown in FIG. 7 are mounted, these are drawn in a simplified form here. After mounting photodetecting and light emitting members 30, dicing lines 56 are set at central portions between the adjacent protrusions 51.

When dicing lines 56 have been set, the base material of base member 50 is cut along the dicing lines 56 by a dicing blade. By thus cutting the base material of base member 50, base members 20, onto each of which the photodetecting and light emitting member 30 is mounted, are manufactured.

With each base member 20 thus manufactured, the protrusion 51 of the base material of base member 50 becomes the inserted portion 22 of the base member 20 and the recessed portion of the base material of base member 50 becomes the supporting portion 21 of the base member 20. Of reflecting surfaces 55, surfaces positioned above photodetecting units 34 (FIG. 7) become receiving light reflecting surfaces 27, and surfaces positioned above light emitting units 37 become transmitting light reflecting surfaces 26.

Figure 10:
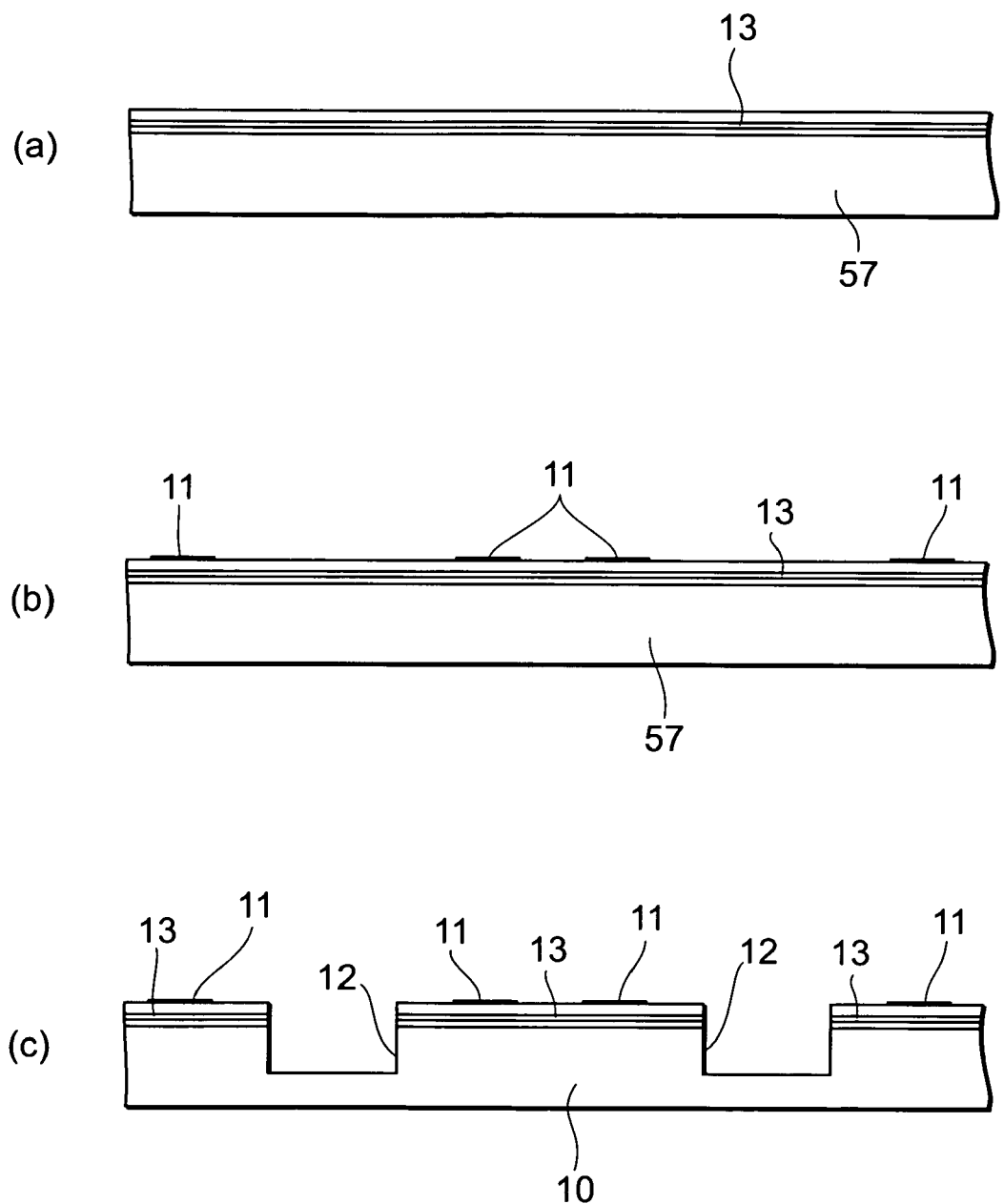
FIG. 10 shows process diagrams of a process of manufacturing the substrate.

A procedure for manufacturing the substrate 10 shall now be described. FIG. 10 shows process diagrams of a process of manufacturing the substrate.

First, a base material of substrate, formed of a plate-like silicon substrate that is thicker than that which is normally used, is prepared and, as shown in FIG. 10-(a), optical waveguides 13 are formed on a top surface of the substrate base member 57. Optical waveguides 13 are manufactured, for example, from polyimide. Optical waveguides 13 are manufactured in a manner such that the silhouettes thereof take on the forms shown in FIG. 4, and at this stage, are also formed at positions at which recessed portions 12 are to be formed.

When optical waveguides 13 have been formed, predetermined metallized patterns 11 are formed above the optical waveguides on the top surface of the base material of substrate 57. These metallized patterns 11 are formed to shapes such as those shown in FIG. 3. When metallized patterns 11 have been formed on the base material of substrate 57, the base material of substrate 57 is etched along with optical waveguides 13 by reactive ion etching to form the plurality of recessed portions 12 as shown in FIG. 10-(c). Recessed portions 12 are thus formed so as to be connected to optical waveguides 13, and optical waveguides 13 are formed between the plurality of recessed portions 12. Thus, the substrate 10 is manufactured.

Figure 11:
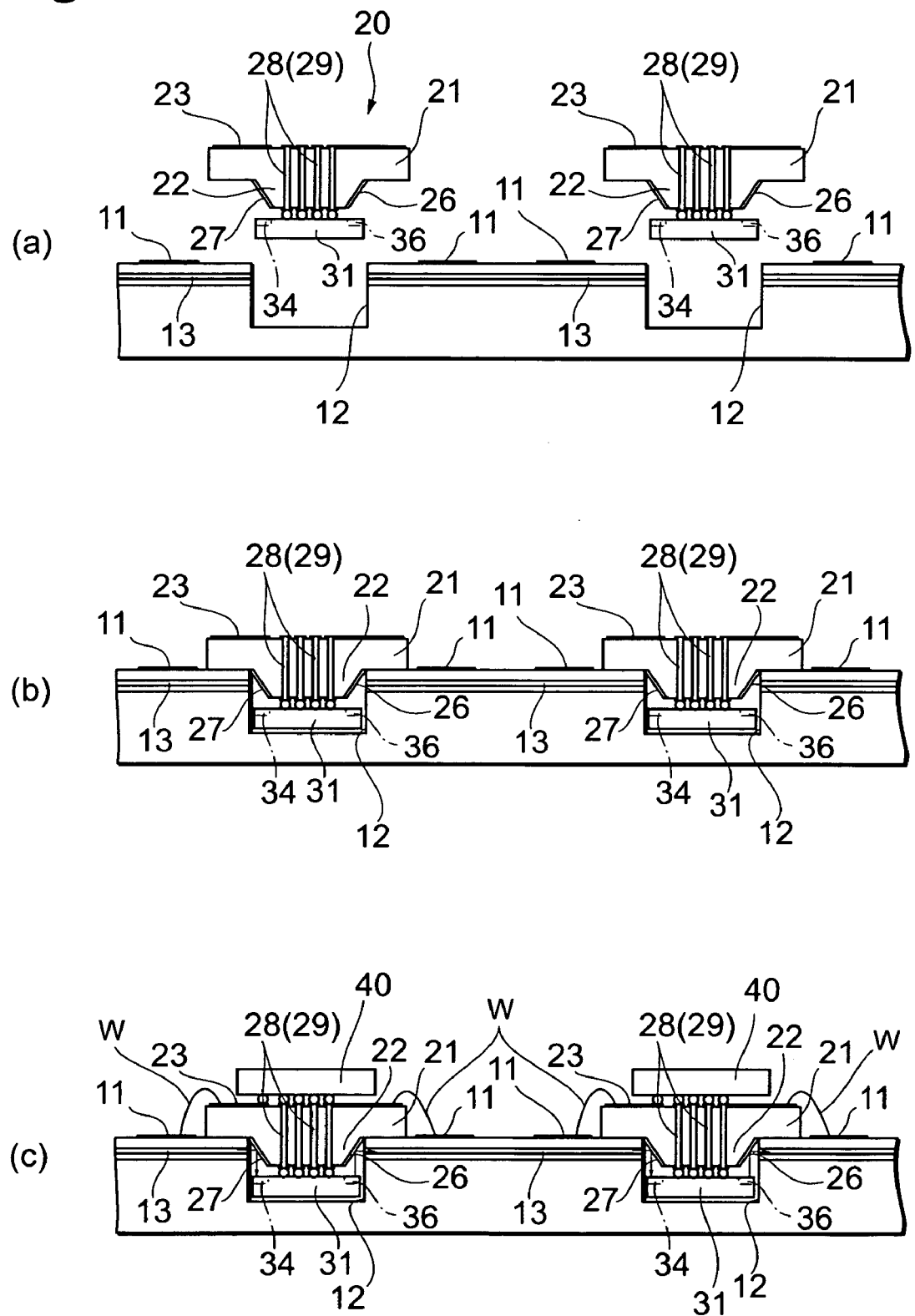
FIG. 11 shows process diagrams of a procedure of assembling the base members and the substrate.

Furthermore, the assembly of the substrate 10 and base members 20 shall now be described. FIG. 11 shows process diagrams of a procedure of assembling the substrate and the base members.

As shown in FIG. 11-(a), inserted portions 22 of the respective base members 20 and photodetecting and light emitting members 30 (indicated as 31 in the FIGURE) mounted onto the inserted portions 22 are inserted into the plurality of recessed portions 12 of the substrate 10. When an inserted portion 22 of a base member 20 and a photodetecting and light emitting member 30 (indicated as 31 in the FIGURE) are inserted as they are, the supporting portion 21 of the base member 20 contacts the top surface of the substrate 10. At this point, the boundary between the supporting portion 21 and the inserted portion 22 of the base member 20 contacts corner portions of the recessed portion 12 of the substrate 10.

Here, each inserted portion 22 of the base member 20 is formed with high precision by anisotropic etching. Thus by the boundary between the supporting portion 21 and the inserted portion 22 of the base member 20 contacting corner portions of the recessed portion 12 of the substrate 10, the base member 20 is positioned with high precision with respect to the substrate 10. As a result, optical waveguides 13, disposed in the substrate 10, and reflecting surfaces 26 and 27, disposed on the inserted portion 22 of the base member 20, can be positioned with high precision, and thus optical waveguides 13 and photodetecting units 34 and optical waveguides 13 and light emitting units 37 can be positioned with high precision.

Here, if the upper surface of the inserted portion 22 that forms the boundary with the supporting portion 21 is larger than the opening of the recessed portion 12, the inserted portion 22 will not be completely inserted into the recessed portion 12, and the supporting member 21 will be slightly floated from the substrate 10. Even in this case, since reflecting films 26 and 27 are formed at predetermined angles, optical waveguides 13 and photodetecting units 34 and optical waveguides 13 and light emitting units 37 can be positioned with high precision.

The lights emitted from the light emitting units 37 are thus reflected by the transmitting light reflecting surfaces 26 and guided highly precisely into the optical waveguides 13. Also, the lights emitted from the optical waveguides 13 are reflected by receiving light reflecting surfaces 27 and made incident with high precision onto photodetecting units 34.

When the inserted portion 22 and photodetecting and light emitting member 30 (indicated as 31 in the FIGURE) of the base member 20 have thus been inserted into the substrate 10, the LSI 40 is flip chip bonded onto the upper surface of the supporting portion 21 of the base member 20 as shown in FIG. 11-(c). In accompaniment, metallized patterns 23, disposed on the base member 20, and metallized patterns 11, disposed on the substrate 10, are connected by bonding wires W. The optical wiring board 1 can thus be manufactured.

Figure 12:
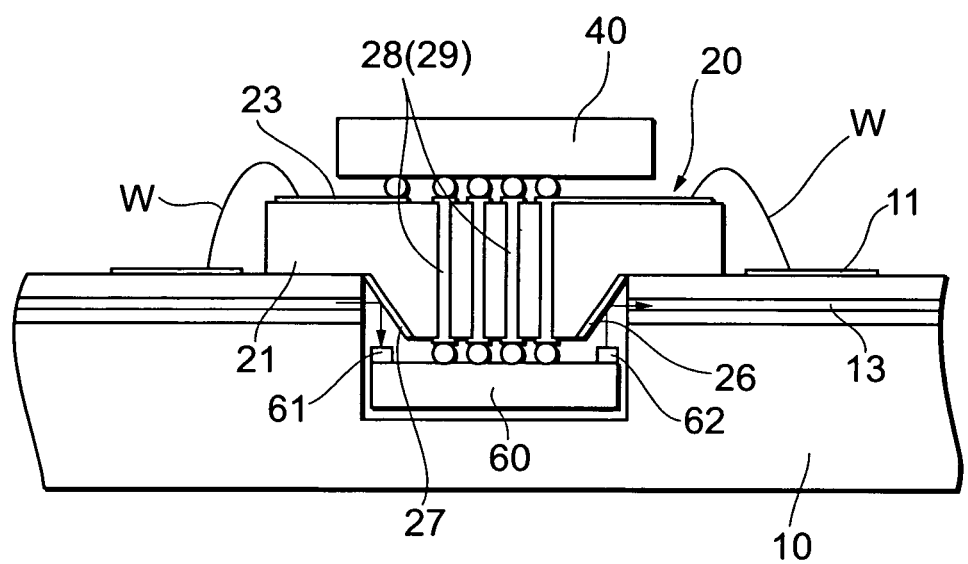
FIG. 12 is a schematic sectional side view of principal portions of an optical wiring substrate according to another embodiment.

Although a favorable embodiment of this invention has been described above, this invention is not restricted to the above-described embodiment. For example, though the photodetecting and light emitting member was directly mounted onto the inserted portion of the base member in the above-described embodiment, a mode is also possible in which the photonic devices are mounted via a wiring substrate for photonic devices. An example of such a mode is shown in FIG. 12. As shown in FIG. 12, a photodetecting element (photonic device) 61 and a light emitting element (photonic device) 62 are mounted at the respective end portions of a wiring substrate 60. Unillustrated wiring patterns are formed on the wiring substrate 60. By the wiring substrate 60 being flip chip bonded to the lower surface of the inserted portion 22 of the base member 20, the photodetecting element 61 and the light emitting element 62 are installed via the wiring substrate 60. An optical wiring substrate of such a mode can thus be arranged.

Also, though with the above-described embodiment, the light emitting elements and the photodetecting elements are provided in each recessed portion 12, a mode in which just light emitting elements or just photodetecting elements are provided is also possible. Furthermore, a mode in which the photodiode arrays of the above-described embodiment are provided with simple amplifiers and the laser diode array has a simple driver incorporated therein is also possible. By providing such amplifiers and drivers, the LSI can be simplified in arrangement. Also, in addition to the wiring functions, optical waveguides 13 of the substrate 10 can be embedded with a wavelength splitting function, branching function, and other optical waveguide functions.

As described above, the optical wiring board 1 includes: an optical wave guide substrate 10, having a plurality of recessed portions 12 and optical waveguides 13 that connect these recessed portions 12 to each other; base members 20, each having an inserted portion 22 that closes the opening of a corresponding recessed portion 12 and protrudes towards the bottom surface of the recessed portion 12; photonic device substrates 30, each being mounted onto the top surface at the recessed portion side of a base member 20 and having photonic devices; and penetration electrodes 28 (29), penetrating base members 20 in the thickness direction and electrically connected to photonic device substrates 30; and reflecting films 26 (27) are provided at the side surfaces of inserted portions 22 and photonic device substrates 30 and optical waveguides 13 are optically coupled via reflecting films 26 (27). With this optical wiring substrate 1, when the inserted portion of a base member is inserted into a recessed portion, the corresponding reflecting surfaces and optical waveguides are readily positioned.

INDUSTRIAL APPLICABILITY

This invention can be used to provide an optical wiring substrate and a method for manufacturing an optical wiring substrate.

The invention claimed is:

1. An optical wiring substrate comprising:
a substrate, having a plurality of recessed portions formed therein;
optical waveguides, formed on the substrate and positioned between the plurality of recessed portions;
a plurality of base members, each having
 an inserted portion, in turn having inclined surfaces formed thereon and being inserted into the recessed portion, and
 a supporting portion, supporting the inserted portion inserted into the recessed portion;
photonic devices, each being mounted onto the inserted portion of the base member and positioned at an inner side of the recessed portion of the substrate;
penetration electrodes, each penetrating through from a base member surface on which the photonic device is mounted to a base member surface at the opposite side; and
reflecting surfaces, each formed on the inclined surface of the inserted portion, wherein the reflecting surfaces and the optical waveguides are positioned by inserting the inserted portions of the base members into the recessed portions, and wherein the inclination angle of the reflecting surface being adjusted to an angle, by which optical paths are matched between the optical waveguide and the photonic devices.

2. The optical wiring substrate according to claim 1, wherein a photonic device, positioned at a recessed portion at one end of the optical waveguide, is a light emitting element, and a photonic device, positioned at a recessed portion at the other end of the optical waveguide, is a photodetecting element.

3. The optical wiring substrate according to claim 1, wherein a light emitting element and a photodetecting element are disposed as photonic devices in a single recessed portion.

4. The optical wiring substrate according to claim 1, wherein the photonic devices are mounted onto the base member via a wiring substrate.

5. The optical wiring substrate according to claim 1, wherein the photonic devices are directly mounted on the base member.

6. The optical wiring substrate according to claim 1, wherein the base members are silicon substrates.

7. The optical wiring substrate according to claim 1, wherein the inclined surfaces are formed by anisotropic etching.

8. The optical wiring substrate according to claim 1, wherein the shapes of the inserted portions and the recessed portions, as observed in the direction of looking into the recessed portions, are polygonal shapes.

* * * * *